(12) United States Patent
Nakayama et al.

(10) Patent No.: US 12,092,775 B2
(45) Date of Patent: Sep. 17, 2024

(54) RADIATION DETECTOR

(71) Applicant: KABUSHIKI KAISHA TOSHIBA, Tokyo (JP)

(72) Inventors: Kohei Nakayama, Kawasaki (JP); Fumihiko Aiga, Kawasaki (JP); Isao Takasu, Setagaya (JP); Atsushi Wada, Kawasaki (JP); Yuko Nomura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 298 days.

(21) Appl. No.: 17/652,130

(22) Filed: Feb. 23, 2022

(65) Prior Publication Data

US 2023/0056144 A1 Feb. 23, 2023

(30) Foreign Application Priority Data

Aug. 18, 2021 (JP) .................... 2021-133082

(51) Int. Cl.
*G01T 1/20* (2006.01)
*G01T 1/24* (2006.01)
*H01L 27/146* (2006.01)

(52) U.S. Cl.
CPC .......... *G01T 1/20181* (2020.05); *G01T 1/241* (2013.01); *H01L 27/14663* (2013.01)

(58) Field of Classification Search
CPC ............ G01T 1/20181; G01T 1/241; H01L 27/14663
See application file for complete search history.

(56) References Cited

U.S. PATENT DOCUMENTS

| | | | | |
|---|---|---|---|---|
| 2007/0045554 A1* | 3/2007 | Wakamatsu | ........ | G01T 1/20189 250/370.11 |
| 2007/0051895 A1* | 3/2007 | Mikoshiba | ........ | H01L 27/14676 257/E31.01 |
| 2008/0035849 A1* | 2/2008 | Horiuchi | ............ | G01T 1/20189 250/361 R |
| 2008/0210946 A1* | 9/2008 | Okada | ............... | H01L 27/14603 257/E27.146 |
| 2009/0189231 A1* | 7/2009 | Okada | ............... | H01L 27/14632 257/428 |
| 2010/0051819 A1* | 3/2010 | Jung | .................... | G01T 1/20184 250/370.09 |

(Continued)

FOREIGN PATENT DOCUMENTS

| | | |
|---|---|---|
| JP | 2004-71638 A | 3/2004 |
| JP | 2014-182000 A | 9/2014 |

(Continued)

*Primary Examiner* — Blake C Riddick
(74) *Attorney, Agent, or Firm* — Oblon, McClelland, Maier & Neustadt, L.L.P.

(57) ABSTRACT

According to one embodiment, a radiation detector includes a first conductive layer including a first conductive region, and a first stacked body. The first stacked body includes a first electrode separated from the first conductive region in the a direction, a first scintillator layer provided between the first conductive region and the first electrode, a first intermediate electrode provided between the first scintillator layer and the first electrode, and a first organic semiconductor layer provided between the first intermediate electrode and the first electrode.

19 Claims, 7 Drawing Sheets

(56) References Cited

U.S. PATENT DOCUMENTS

| | | | |
|---|---|---|---|
| 2010/0163737 A1* | 7/2010 | Masuda | H04N 5/32 250/361 R |
| 2011/0147741 A1* | 6/2011 | Jung | H01L 31/022408 257/53 |
| 2011/0180714 A1* | 7/2011 | Okada | G01T 1/243 250/354.1 |
| 2011/0180889 A1* | 7/2011 | Jung | H01L 27/14663 257/E27.122 |
| 2011/0241701 A1* | 10/2011 | Imai | H01L 31/101 324/629 |
| 2012/0025190 A1* | 2/2012 | Okada | H01L 27/14676 257/E31.129 |
| 2012/0201350 A1* | 8/2012 | Kim | H01L 27/14663 438/73 |
| 2012/0261581 A1* | 10/2012 | Fujiyoshi | H01L 27/14632 250/361 R |
| 2012/0305785 A1* | 12/2012 | Fujiyoshi | H01L 27/14676 257/E27.122 |
| 2012/0306041 A1* | 12/2012 | Fujiyoshi | H01L 27/1461 257/E31.124 |
| 2013/0032389 A1* | 2/2013 | Tokura | G01T 1/20184 174/264 |
| 2013/0048860 A1* | 2/2013 | Nishino | G01T 1/20186 250/361 R |
| 2013/0048861 A1* | 2/2013 | Ohta | H01L 27/14692 250/366 |
| 2013/0048862 A1* | 2/2013 | Nakatsugawa | H01L 27/14663 438/69 |
| 2013/0048863 A1* | 2/2013 | Ohta | H10K 39/36 438/69 |
| 2013/0048865 A1* | 2/2013 | Nishino | G01T 1/2006 250/366 |
| 2013/0048960 A1* | 2/2013 | Nishino | H10K 39/00 257/E51.026 |
| 2013/0082184 A1* | 4/2013 | Nakatsugawa | A61B 6/4266 250/361 R |
| 2013/0299711 A1* | 11/2013 | Mochizuki | H01L 27/14643 257/292 |
| 2014/0035006 A1* | 2/2014 | Fujiyoshi | H01L 27/14812 257/225 |
| 2014/0239183 A1* | 8/2014 | Yamazaki | G01T 1/20184 250/361 R |
| 2014/0339431 A1* | 11/2014 | Watanabe | H01L 27/14663 250/363.01 |
| 2014/0374610 A1* | 12/2014 | Nishino | G01T 1/20184 250/370.09 |
| 2015/0380457 A1* | 12/2015 | Fujii | G01T 1/241 378/19 |
| 2016/0025868 A1* | 1/2016 | Nishino | G01T 1/202 250/366 |
| 2016/0163754 A1* | 6/2016 | Igarashi | H01L 27/14663 438/69 |
| 2016/0320494 A1* | 11/2016 | Hartmann | G01T 1/16 |
| 2017/0154916 A1* | 6/2017 | Mori | H04N 25/62 |
| 2017/0168166 A1* | 6/2017 | Fischer | B05D 3/12 |
| 2018/0143329 A1 | 5/2018 | Takasu et al. | |
| 2018/0143331 A1* | 5/2018 | Maeda | H01L 27/14632 |
| 2018/0267180 A1* | 9/2018 | Sugi | H10K 30/82 |
| 2019/0198558 A1* | 6/2019 | Jeon | H01L 27/14663 |
| 2019/0257960 A1* | 8/2019 | Hasegawa | G01T 1/38 |
| 2020/0083298 A1* | 3/2020 | Hasegawa | H10K 39/32 |
| 2022/0082711 A1 | 3/2022 | Nakayama et al. | |

FOREIGN PATENT DOCUMENTS

| | | |
|---|---|---|
| JP | 2018-85387 A | 5/2018 |
| WO | WO 2013/133136 A1 | 9/2013 |

* cited by examiner

RADIATION DETECTOR

CROSS-REFERENCE TO RELATED APPLICATIONS

This application is based upon and claims the benefit of priority from Japanese Patent Application No. 2021-133082, filed on Aug. 18, 2021; the entire contents of which are incorporated herein by reference.

FIELD

Embodiments described herein relate generally to a radiation detector.

BACKGROUND

Stable detection is desired in a radiation detector.

DETAILED DESCRIPTION

Figure 1A:
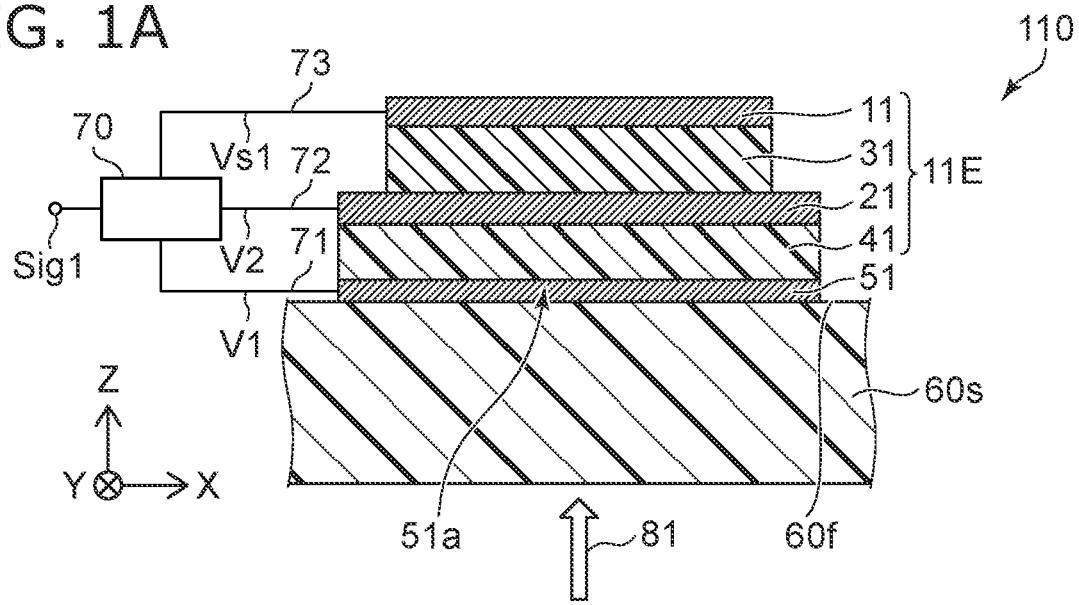
FIGS. 1A and 1B are schematic cross-sectional views illustrating a radiation detector according to a first embodiment.

According to one embodiment, a radiation detector includes a first conductive layer including a first conductive region, and a first stacked body. The first stacked body includes a first electrode separated from the first conductive region in the direction, a first scintillator layer provided between the first conductive region and the first electrode, a first intermediate electrode provided between the first scintillator layer and the first electrode, and a first organic semiconductor layer provided between the first intermediate electrode and the first electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
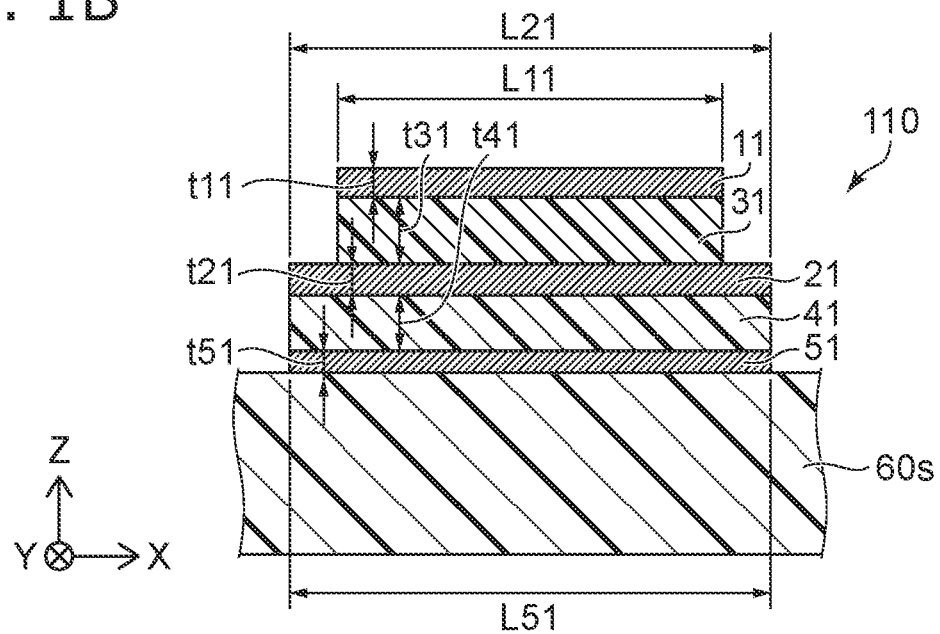

FIGS. 1A and 1B are schematic cross-sectional views illustrating a radiation detector according to a first embodiment. As shown in FIG. 1A, a radiation detector 110 according to the embodiment includes a first conductive layer 51 and a first stacked body 11E. The first conductive layer 51 includes the first conductive region 51a.

The first stacked body 11E includes a first electrode 11, a first scintillator layer 41, a first intermediate electrode 21, and a first organic semiconductor layer 31.

The first electrode 11 is separated from the first conductive region 51a in a first direction. The first direction is a Z-axis direction. One direction perpendicular to the Z-axis direction is defined as an X-axis direction. The direction perpendicular to the Z-axis direction and the X-axis direction is defined as a Y-axis direction. The direction from the first conductive region 51a to the first electrode 11 corresponds to the first direction (Z-axis direction).

The first scintillator layer 41 is provided between the first conductive region 51a and the first electrode 11. The first intermediate electrode 21 is provided between the first scintillator layer 41 and the first electrode 11. The first organic semiconductor layer 31 is provided between the first intermediate electrode 21 and the first electrode 11.

Radiation 81 passes through the first conductive layer 51 and is incident on the first scintillator layer 41 of the first stacked body 11E. In the first scintillator layer 41, light is generated according to the incident radiation 81. The generated light is incident on the first organic semiconductor layer 31 to generate a movable charge. By extracting the signal corresponding to the electric charge, the radiation 81 being incident can be detected.

As shown in FIG. 1A, a controller 70 may be provided. The radiation detector 110 may include the controller 70. The controller 70 may be provided separately from the radiation detector 110.

The radiation detector 110 may include first to third wirings 71 to 73. The first wiring 71 electrically connects the first conductive layer 51 to the controller 70. The second wiring 72 electrically connects the first intermediate electrode 21 to the controller 70. The third wiring 73 electrically connects the first electrode 11 to the controller 70.

For example, the controller 70 sets the first conductive layer 51 at a first potential V1 and the first intermediate electrode 21 at a second potential V2. The first potential V1 is, for example, a fixed potential. The first potential V1 may be, for example, a ground potential. The second potential V2 is, for example, a bias potential (bias voltage). The second potential V2 is, for example, not less than −50 V and not more than −5 V. In the embodiment, the polarity and absolute value of the second potential V2 can be changed in various ways.

In state where such a potential is set, radiation 81 is incident on the first scintillator layer 41. As described above, an electric signal (signal Vs1) is obtained from the first electrode 11 according to the incident radiation 81. The controller 70 can output a signal Sig1 corresponding to the signal Vs1. The controller 70 may include a power supply unit and a detection unit. The power supply unit sets the above potential. The detection unit can amplify the above signal Vs1. The detection unit may include an amplifier.

In the embodiment, the first scintillator layer 41 is provided between the first conductive layer 51 and the first intermediate electrode 21. The first scintillator layer 41, the first conductive layer 51, and the first intermediate electrode 21 can function as capacitors. As a result, the potential of the first intermediate electrode 21 becomes more stable. According to the embodiment, it is possible to provide a radiation detector capable of stable detection.

For example, the radiation 81 is incident and the signal Vs1 is taken out from the first electrode 11. At this time, the potential of the first intermediate electrode 21 may be affected and changed according to the temporal change of the signal Vs1. In the embodiment, the fluctuation of the potential of the first intermediate electrode 21 is suppressed by the capacitors based on the first scintillator layer 41, the first conductive layer 51 and the first intermediate electrode 21.

For example, in order to suppress the fluctuation of the potential of the first intermediate electrode 21 according to the temporal change of the signal Vs1, a reference example in which a capacitor element is provided separately from the first stacked body 11E can be considered. In this reference example, since another capacitor element is provided, the structure becomes complicated. Another capacitor element may attenuate the radiation 81, resulting in poor detection characteristics of the radiation 81.

In the embodiment, no separate capacitor is required. In the first scintillator layer 41, the first conductive layer 51, and the first intermediate electrode 21, the attenuation of the radiation 81 is slight. The adverse effect on the detection characteristics of the radiation 81 is suppressed, and stable detection is possible.

In the embodiment, at least one of the first electrode 11 or the first intermediate electrode 21 includes, for example, at least one selected from the group consisting of Al, Be, Mg, Zn and C. As a result, the radiation 81 can be detected efficiently. The first conductive layer 51 may include, for example, a metal. The first conductive layer 51 may include, for example, the same material as the first electrode 11.

At least a part of the first intermediate electrode 21 may include a compound including a first element and oxygen. The first element includes at least one selected from the group consisting of In and Zn. At least a part of the first intermediate electrode 21 may include, for example, indium oxide, ITO (Indium Tin Oxide), or the like. The light generated in the first scintillator layer 41 can be efficiently incident on the first organic semiconductor layer 31. High sensitivity is easy to obtain.

As shown in FIG. 1A, the radiation detector 110 may include a base body 60s. The base body 60s includes, for example, a resin. The base body 60s may be, for example, a resin substrate, a resin film, or the like. The base body 60s includes a first surface 60f. The first conductive layer 51 is located between the first surface 60f and the first stacked body 11E. For example, the first conductive layer 51 is provided on the first surface 60f. The first stacked body 11E is provided on the first conductive layer 51.

As shown in FIG. 1B, a length (width) of the first conductive layer 51 along a second direction crossing the first direction (Z-axis direction) is defined as a first conductive layer length L51. The second direction is, for example, the X-axis direction. A length (width) of the first electrode 11 along the second direction is defined as a first electrode length L11. The first conductive layer length L51 is preferably longer than the first electrode length L11. For example, the size of the first conductive layer 51 (length in any direction) is preferably larger than the size of the first electrode 11 (length in any direction). Thereby, for example, the electric capacitance of the capacitor by the first scintillator layer 41, the first conductive layer 51, and the first intermediate electrode 21 can be increased. This makes it easy to stabilize the potential of the first intermediate electrode 21.

As shown in FIG. 1B, a length (width) of the first intermediate electrode 21 along the second direction (X-axis direction) is defined as a first intermediate electrode length L21. The first intermediate electrode length L21 is preferably longer than the first electrode length L11. Thereby, for example, the electric capacitance of the capacitor by the first scintillator layer 41, the first conductive layer 51, and the first intermediate electrode 21 can be increased. This makes it easy to stabilize the potential of the first intermediate electrode 21.

In the embodiment, a thickness t41 of the first scintillator layer 41 along the first direction (Z-axis direction) is, for example, not less than $10^2$ times and not more than $10^4$ times a thickness t31 of the first organic semiconductor layer 31 along the first direction. For example, the electric capacitance of the capacitor by the first scintillator layer 41, the first conductive layer 51, and the first intermediate electrode 21 can be appropriately increased.

For example, the thickness t41 is preferably not less than 100 μm and not more than 5 mm. When the thickness t41 is 300 μm or more, for example, the radiation 81 to be detected (for example, β-ray or X-ray) can be easily detected with higher accuracy. When the thickness t41 is 5 mm or less, for example, the radiation 81 to be detected can be easily distinguished.

In one example, the capacitance between the first conductive layer 51 and the first intermediate electrode 21 may be greater than 1/50 times the capacitance between the first intermediate electrode 21 and the first electrode 11. It is easier to stabilize the potential of the first intermediate electrode 21.

For example, the thickness t31 is preferably not less than 0.5 μm and not more than 1 μm. When the thickness t31 is 0.5 μm or more, for example, low energy radiation 81 can be easily detected. When the thickness t31 is 1 μm or less, for example, it becomes easy to distinguish a plurality of continuously incident radiations 81.

A thickness t51 of the first conductive layer 51 along the first direction (Z-axis direction) is preferably, for example, not less than 0.1 μm and not more than 5 μm. When the thickness t51 is 0.1 μm or more, for example, low energy radiation 81 can be easily detected. When the thickness t51 is 5 μm or less, for example, the radiation 81 to be detected can be easily distinguished.

A thickness t21 of the first intermediate electrode 21 along the first direction (Z-axis direction) is preferably, for example, not less than 30 nm and not more than 1 μm. When the thickness t21 is 30 nm or more, for example, it becomes easy to distinguish the low energy radiation 81. When the thickness t21 is 1 μm or less, for example, the radiation 81 to be detected can be easily distinguished.

A thickness t11 of the first electrode 11 along the first direction (Z-axis direction) is preferably, for example, not less than 0.1 μm and not more than 5 μm. When the thickness t11 is 0.1 μm or more, for example, low energy radiation 81 can be easily detected. When the thickness t11 is 5 μm or less, for example, the radiation 81 to be detected can be easily distinguished.

Figure 2:
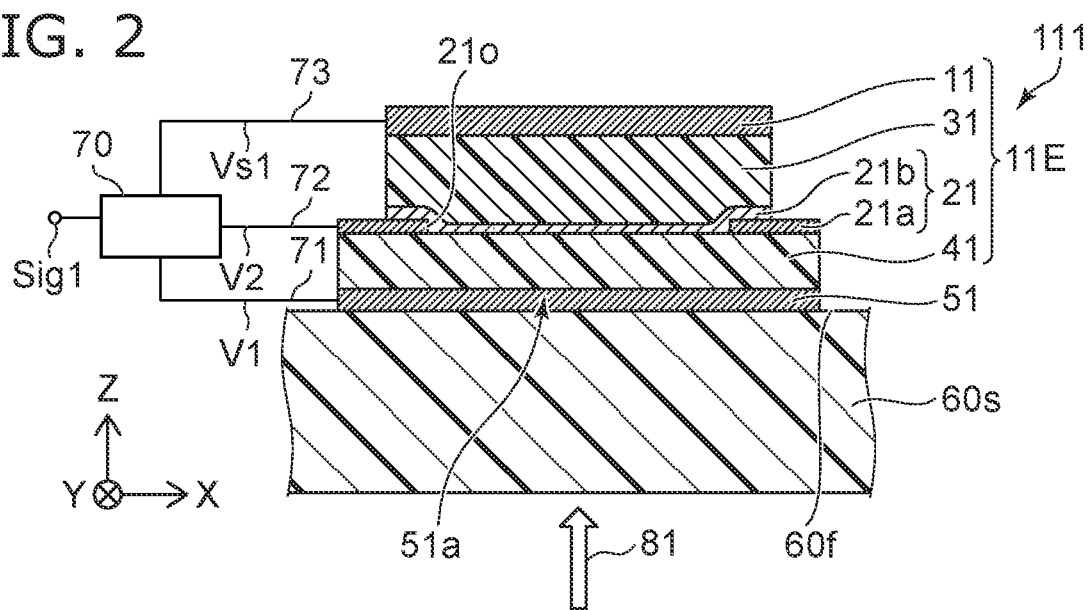
FIG. 2 is a schematic cross-sectional view illustrating a radiation detector according to the first embodiment.

FIG. 2 is a schematic cross-sectional view illustrating a radiation detector according to the first embodiment.

As shown in FIG. 2, in a radiation detector 111 according to the embodiment, the first intermediate electrode 21 includes a first conductive film 21a and a second conductive film 21b. The first conductive film 21a includes an opening 21o. The opening 21o is, for example, a hole or groove. The opening 210 corresponds to, for example, a portion where the first conductive film 21a is not provided. At least a part of the second conductive film 21b is in the opening 21o. For example, at least a part of the second conductive film 21b overlaps the first conductive film 21a in the first direction (Z-axis direction).

For example, the first conductive film 21a includes at least one selected from the group consisting of Al, Be, Mg, Zn and C. The second conductive film 21b includes a compound including the first element and oxygen. The first element includes at least one selected from the group consisting of In and Zn. The second conductive film 21b includes, for example, indium oxide, ITO, and the like.

A light transmittance of the second conductive film 21b with respect to the peak wavelength of the light emitted from the first scintillator layer 41 is higher than a light transmittance of the first conductive film 21a with respect to the peak wavelength. The second conductive film 21b is, for example, light transmissive. The electrical resistivity of the first conductive film 21a is lower than the electrical resistivity of the second conductive film 21b. By applying such a stacked structure, high light transmittance and low electrical resistance can be obtained. Higher sensitivity detection can be performed stably.

Figure 3A:
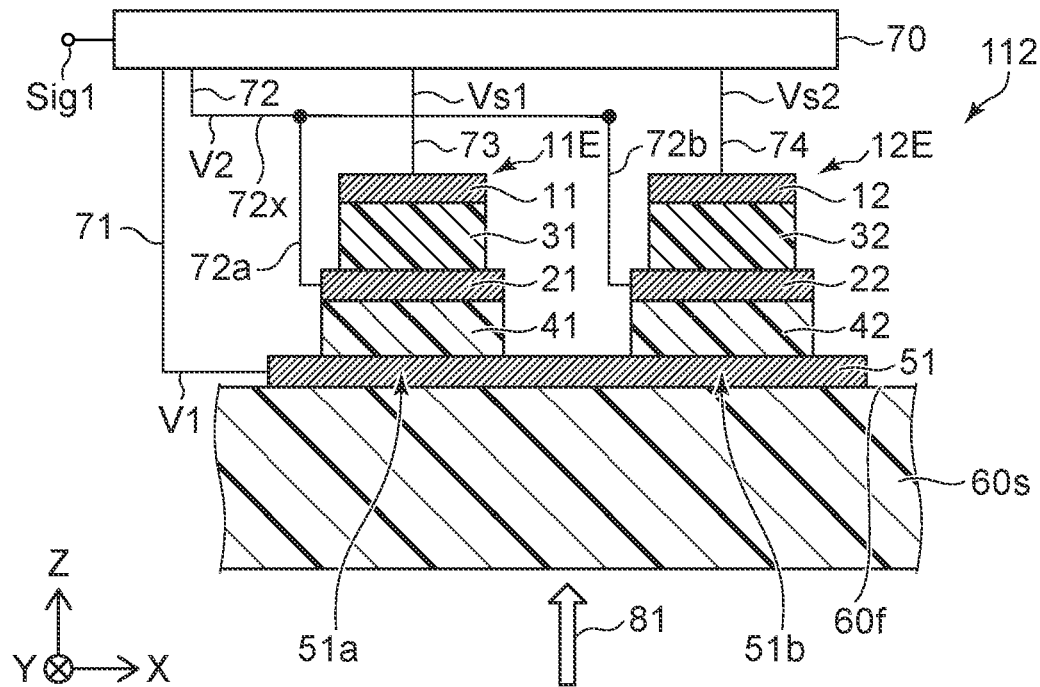
FIGS. 3A and 3B are schematic cross-sectional views illustrating a radiation detector according to the first embodiment.
Figure 3B:
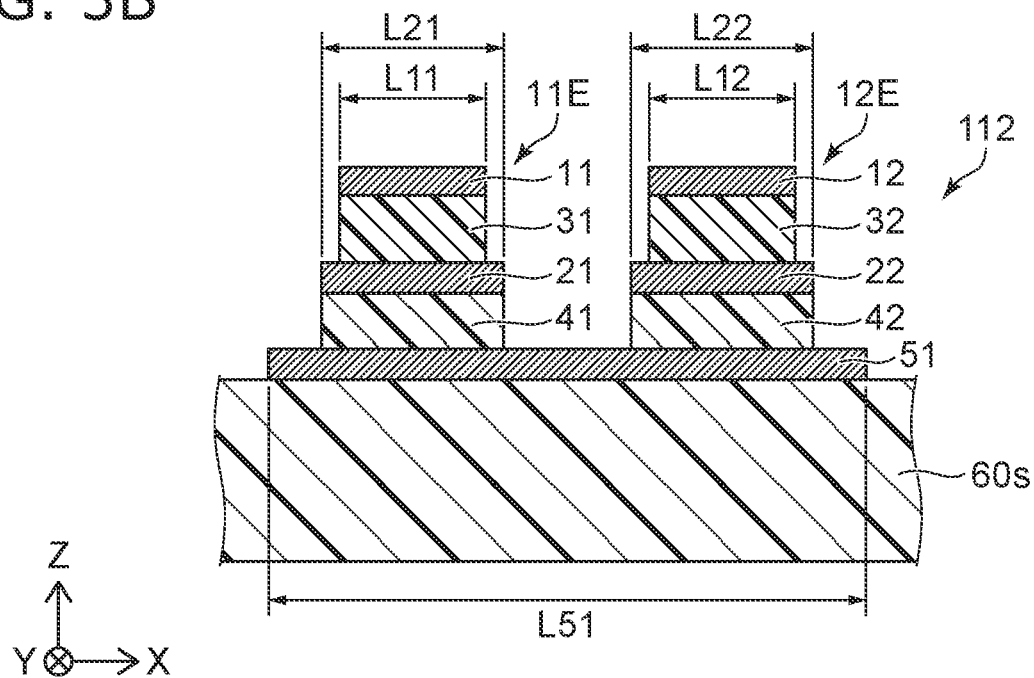

FIGS. 3A and 3B are schematic cross-sectional views illustrating a radiation detector according to the first embodiment.

As shown in FIG. 3A, a radiation detector 112 according to the embodiment includes the first conductive layer 51, the first stacked body 11E, and a second stacked body 12E. Other configurations of the radiation detector 112 may be the same as the configuration of the radiation detector 110 or the radiation detector 111.

As shown in FIG. 3A, the first conductive layer 51 further includes a second conductive region 51b. A direction from the first conductive region 51a to the second conductive region 51b crosses the first direction (Z-axis direction). The boundary between the first conductive region 51a and the second conductive region 51b may be clear or unclear. The first conductive region 51a is continuous with the second conductive region 51b.

The second stacked body 12E includes a second electrode 12, a second scintillator layer 42, a second intermediate electrode 22, and a second organic semiconductor layer 32. The second electrode 12 is separated from the second conductive region 51b in the first direction (Z-axis direction). A region of the first conductive layer 51 overlapping the first electrode 11 in the Z-axis direction corresponds to the first conductive region 51a. In the first conductive layer 51, a region overlapping the second electrode 12 in the Z-axis direction corresponds to the second conductive region 51b.

The second scintillator layer 42 is provided between the second conductive region 51b and the second electrode 12. The second intermediate electrode 22 is provided between the second scintillator layer 42 and the second electrode 12. The second organic semiconductor layer 32 is provided between the second intermediate electrode 22 and the second electrode 12.

The first stacked body 11E functions as one element (for example, a pixel) for detection. The second stacked body 12E functions as another element (eg, pixel) for detection.

The radiation detector 112 may be provided with the first wiring 71, the second wiring 72, the third wiring 73, and the fourth wiring 74. These wirings may be included in the radiation detector 112. The first wiring 71 electrically connects the first conductive layer 51 to the controller 70. The second wiring 72 electrically connects the first intermediate electrode 21 and the second intermediate electrode 22 to the controller 70. In this example, the second wiring 72 includes a common portion 72x, a first wiring layer 72a, and a second wiring layer 72b. One end of the first wiring layer 72a is electrically connected to the first intermediate electrode 21. The other end of the first wiring layer 72a is electrically connected to the common portion 72x. One end of the second wiring layer 72b is electrically connected to the second intermediate electrode 22. The other end of the second wiring layer 72b is electrically connected to the common portion 72x. The common portion 72x is electrically connected to the controller 70.

The third wiring 73 electrically connects the first electrode 11 to the controller 70. The fourth wiring 74 electrically connects the second electrode 12 to the controller 70.

The controller 70 sets the first conductive layer 51 at the first potential V1 and sets the first intermediate electrode 21 and the second intermediate electrode 22 at the second potential V2. The controller 70 can output the signal Sig1 corresponding to the signal Vs1 obtained from the first electrode 11 generated in response to the radiation 81 incident on the first scintillator layer 41. The controller 70 can output the signal Sig1 corresponding to the signal Vs2 obtained from the second electrode 12 generated in response to the radiation 81 incident on the second scintillator layer 42.

In the radiation detector 112, one capacitor (first capacitor) is formed by the first scintillator layer 41, the first conductive layer 51, and the first intermediate electrode 21. Another capacitor (second capacitor) is formed by the second scintillator layer 42, the first conductive layer 51, and the second intermediate electrode 22. The fluctuation of the potential of the first intermediate electrode 21 according to the signal Vs1 due to the incident radiation 81 can be suppressed. The fluctuation of the potential of the second intermediate electrode 22 according to the signal Vs2 due to the incident radiation 81 can be suppressed. For example, crosstalk can be suppressed. A radiation detector capable of stable detection can be provided.

As shown in FIG. 3B, for example, the first conductive layer length L51 of the first conductive layer 51 along the second direction crossing the first direction (Z-axis direction) is longer than the first electrode length L11 of the first electrode 11 along the second direction (for example, the X-axis direction). The first conductive layer length L51 is longer than the second electrode length L12 of the second electrode 12 along the second direction. As a result, a large electric capacitance can be easily obtained in the first capacitor and the second capacitor.

In the embodiment, the first intermediate electrode length L21 of the first intermediate electrode 21 along the second direction (for example, the X-axis direction) is longer than the first electrode length L11. The second intermediate electrode length L22 of the second intermediate electrode 22 along the second direction is longer than the second electrode length L12. As a result, a large electric capacitance can be easily obtained in the first capacitor and the second capacitor.

For example, the capacitance between the first conductive layer 51 and the first intermediate electrode 21 is larger than the capacitance between the first intermediate electrode 21 and the first electrode 11. It is easier to stabilize the potential of the first intermediate electrode 21. For example, the capacitance between the first conductive layer 51 and the second intermediate electrode 22 is larger than the capacitance between the second intermediate electrode 22 and the second electrode 12. It is easier to stabilize the potential of the second intermediate electrode 22.

Figure 4A:
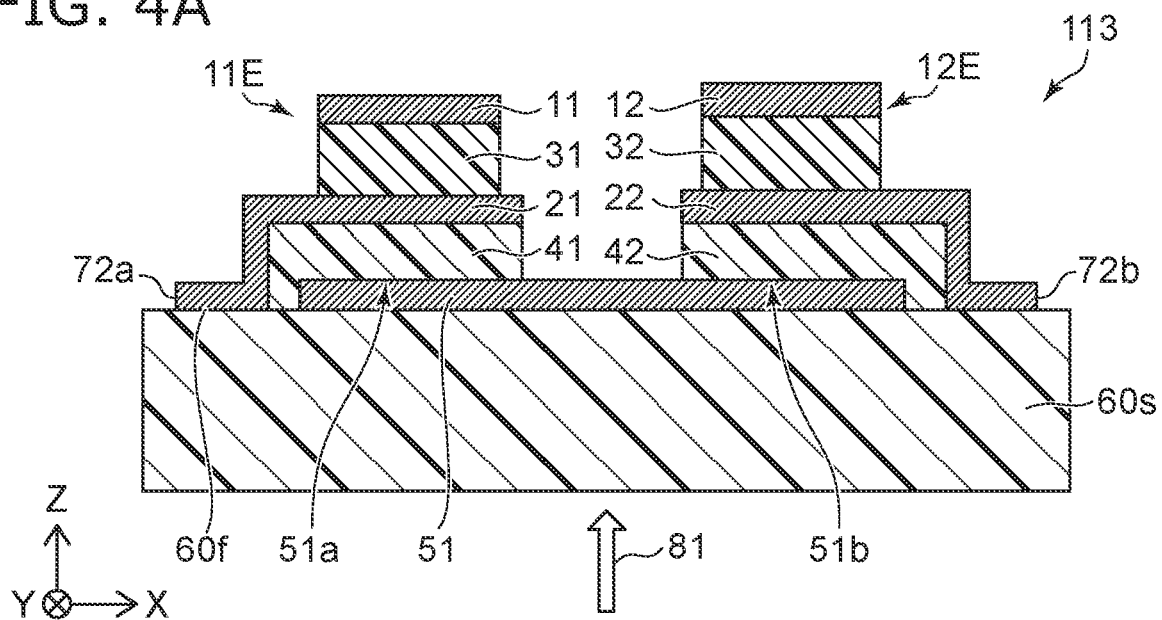
FIGS. 4A and 4B are schematic views illustrating a radiation detector according to the first embodiment.
Figure 4B:
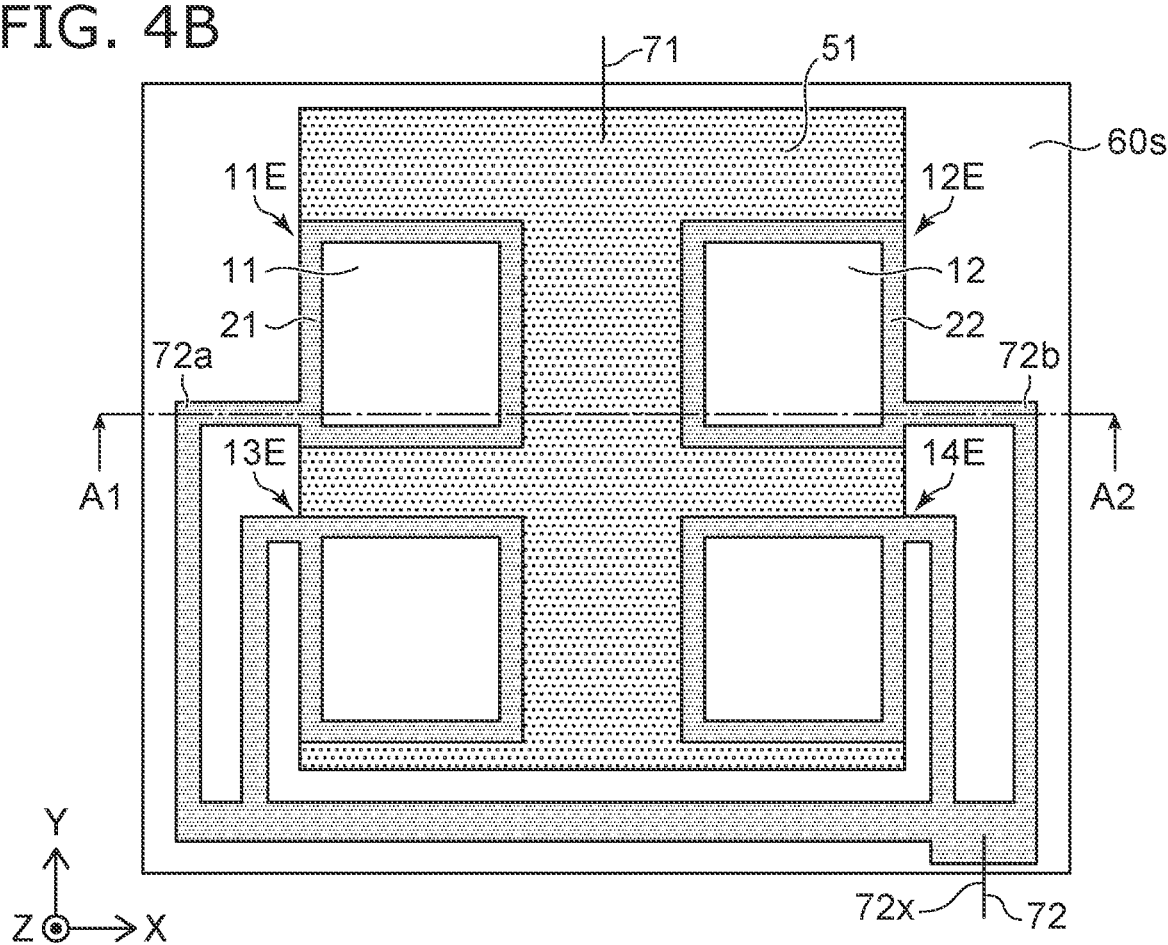

FIGS. 4A and 4B are schematic views illustrating a radiation detector according to the first embodiment.

FIG. 4A is a cross-sectional view taken along the line A1-A2 of FIG. 4B.

As shown in FIG. 4B, a radiation detector 113 according to the embodiment includes the first conductive layer 51, the first stacked body 11E, the second stacked body 12E, a third stacked body 13E, and a fourth stacked body 14E. include. In the radiation detector 113, the configuration described with respect to the radiation detector 112 can be applied to the first conductive layer 51, the first stacked body 11E, and the second stacked body 12E. The configurations of the first stacked body 11E and the second stacked body 12E can be applied to the third stacked body 13E and the fourth stacked body 14E. In the embodiment, a plurality of stacked bodies (detection elements) may be arranged in a matrix in the X-axis direction and the Y-axis direction.

As shown in FIGS. 4A and 4B, a part of the conductive member serving as the first intermediate electrode 21 may be the first wiring layer 72a. A part of the conductive member serving as the second intermediate electrode 22 may be the second wiring layer 72b. A part of the first scintillator layer 41 may be between the conductive member serving as the first intermediate electrode 21 and the first conductive layer 51 in one direction (in this example, the X-axis direction) crossing the first direction. A part of the second scintillator layer 42 may be between the conductive member serving as the second intermediate electrode 22 and the first conductive layer 51 in one direction (X-axis direction in this example) crossing the first direction.

As shown in FIGS. 4A and 4B, the radiation detector 113 may include the base body 60s. The base body 60s includes a resin and includes the first surface 60f. The first conductive layer 51 is located between the first surface 60f and the first stacked body 11E, and between the first surface 60f and the second stacked body 12E. At least a part of the first wiring layer 72a may be provided on the first surface 60f. At least a part of the second wiring layer 72b may be provided on the first surface 60f.

At least one of the first wiring layer 72a or the second wiring layer 72b may include at least one selected from the group consisting of, for example, Al, Be, Mg, Zn and C. As a result, the influence of these wiring layers on the detection of radiation 81 can be suppressed.

Figure 5:
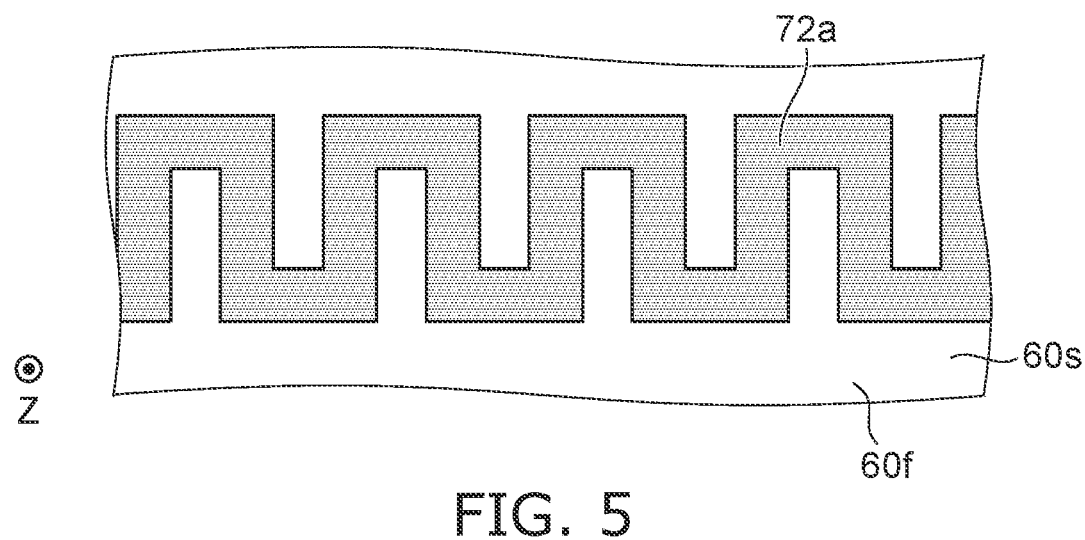
FIG. 5 is a schematic plan view illustrating a part of the radiation detector according to the first embodiment.

FIG. 5 is a schematic plan view illustrating a part of the radiation detector according to the first embodiment.

FIG. 5 illustrates the shape of the first wiring layer 72a (or the second wiring layer 72b). As shown in FIG. 5, the first wiring layer 72a has a meander structure. Due to such a shape, the first wiring layer 72a has an inductor component. For example, the change in the potential of the first intermediate electrode 21 can be further suppressed.

Figure 6A:
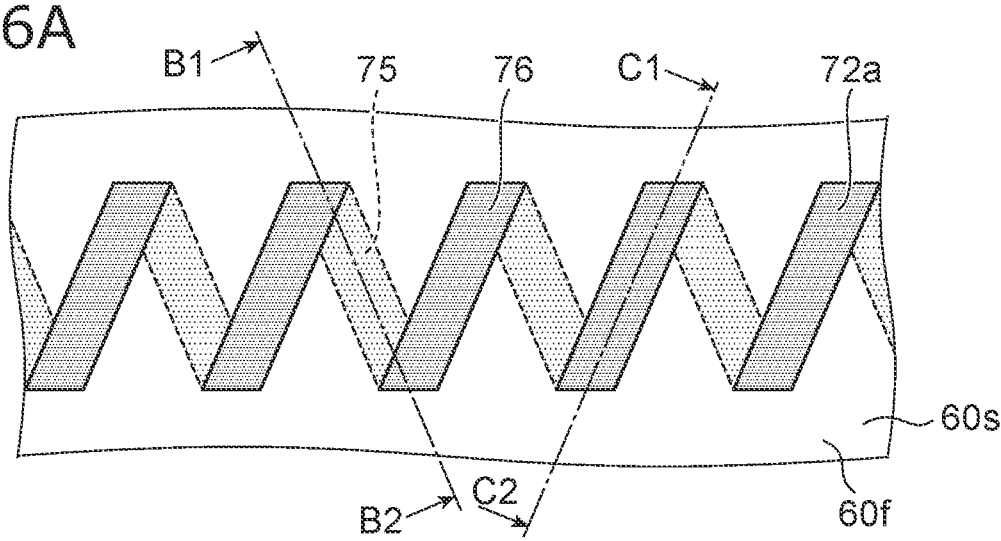
FIGS. 6A to 6C are schematic views illustrating a part of the radiation detector according to the first embodiment.
Figure 6B:
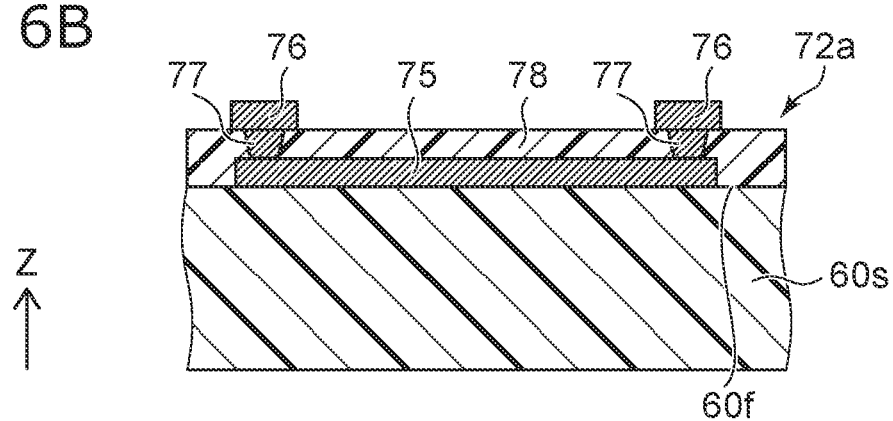
Figure 6C:
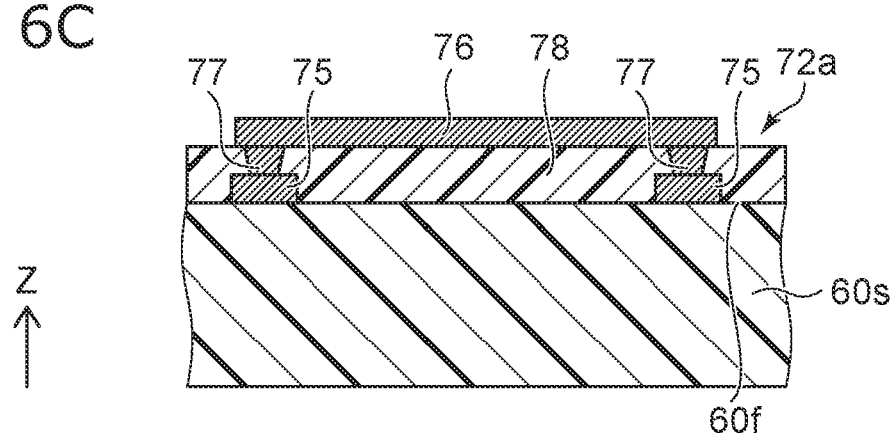

FIG. 6A to 6C are schematic views illustrating a part of the radiation detector according to the first embodiment.

FIG. 6B is a sectional view taken along line B1-B2 of FIG. 6A. FIG. 6C is a cross-sectional view taken along the line C1-C2 of FIG. 6A. These figures illustrate the shape of the first wiring layer 72a (or the second wiring layer 72b).

As shown in FIG. 6A, the first wiring layer 72a has a spiral structure. As shown in FIGS. 6B and 6C, the first wiring layer 72a includes, for example, a plurality of first wiring films 75, a plurality of second wiring films 76, a plurality of connecting members 77, and an insulating member 78. One end of the plurality of first wiring films 75 is electrically connected to one of the plurality of second wiring films 76 by one of the plurality of connecting members 77. Another end of the plurality of first wiring films 75 is electrically connected to one of the plurality of second wiring films 76 by another one of the plurality of connecting members 77.

One end of the plurality of second wiring films 76 is electrically connected to one of the plurality of first wiring films 75 by one of the plurality of connecting members 77. Another end of the plurality of second wiring films 76 is electrically connected to one of the plurality of first wiring films 75 by another one of the plurality of connecting members 77.

An insulating member 78 is provided between the plurality of first wiring films 75 and the plurality of second wiring films 76. With such a configuration, the first wiring layer 72a having a spiral structure can be obtained. Due to such a shape, the first wiring layer 72a has an inductor component. For example, the change in the potential of the first intermediate electrode 21 can be further suppressed.

As described above, in the embodiment, at least a part of the first wiring layer 72a may have at least one of a spiral structure or a meander structure.

Second Embodiment

Figure 7A:
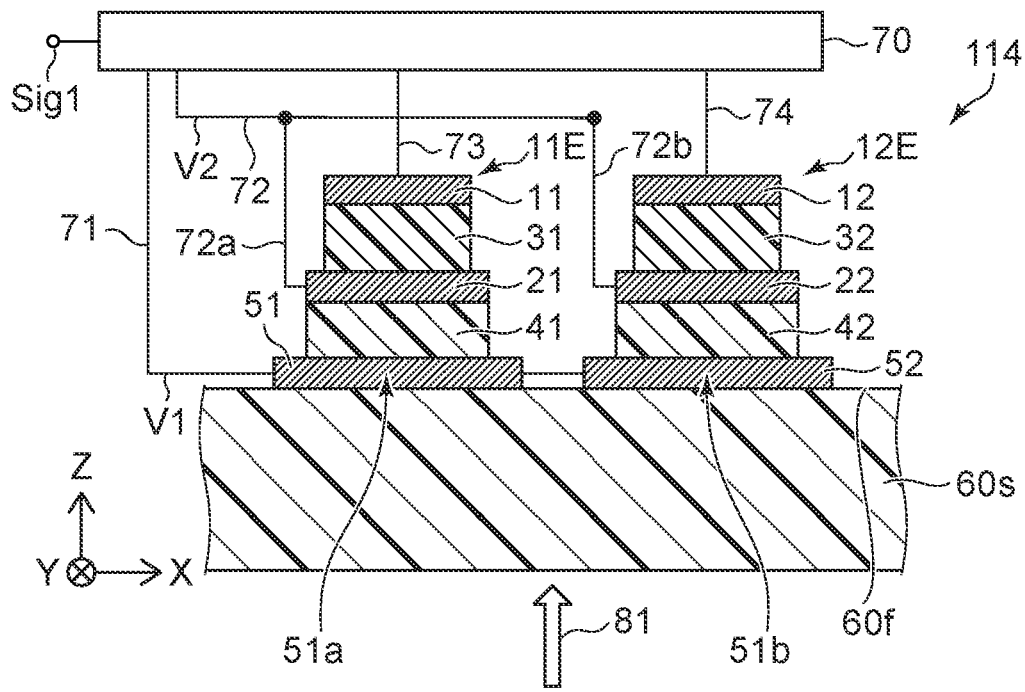
FIGS. 7A and 7B are schematic cross-sectional views illustrating a radiation detector according to a second embodiment.
Figure 7B:
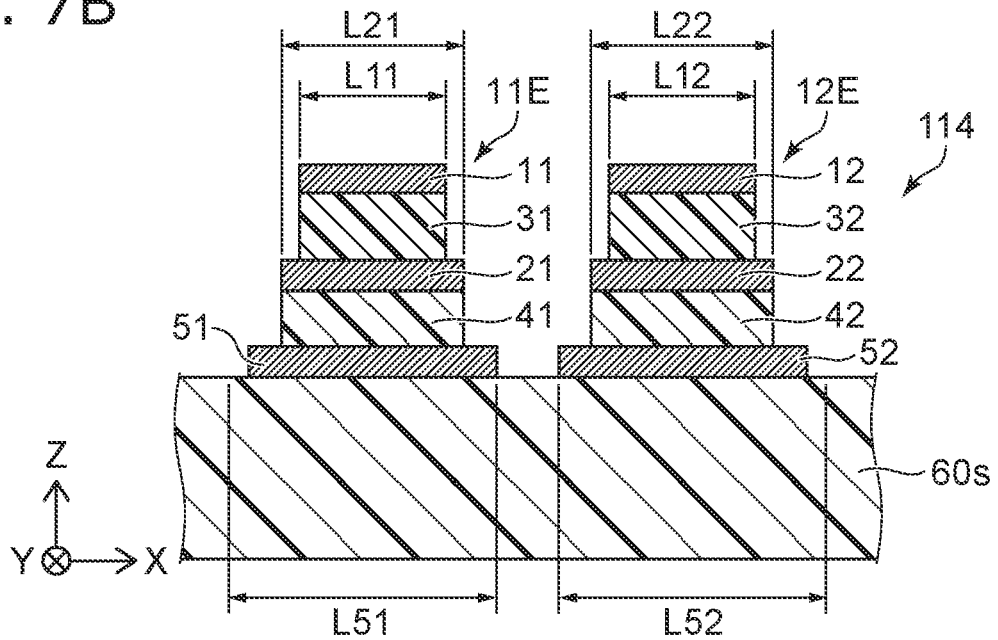

FIGS. 7A and 7B are schematic cross-sectional views illustrating a radiation detector according to the second embodiment.

As shown in FIG. 7A, a radiation detector 114 according to the embodiment includes the first conductive layer 51, the second conductive layer 52, the first stacked body 11E, and the second stacked body 12E. The first conductive layer 51 includes the first conductive region 51a. The second conductive layer 52 includes the second conductive region 51b. The second conductive layer 52 is electrically connected to the first conductive layer 51. The direction from the first conductive region 51a to the second conductive region 51b crosses the first direction (Z-axis direction).

The first stacked body 11E is separated from the first conductive region 51a in the first direction (Z-axis direction). The first scintillator layer 41 is provided between the first conductive region 51a and the first electrode 11. The first intermediate electrode 21 is provided between the first scintillator layer 41 and the first electrode 11. The first organic semiconductor layer 31 is provided between the first intermediate electrode 21 and the first electrode 11.

The second stacked body 12E is separated from the second conductive region 51b in the first direction (Z-axis direction). The second scintillator layer 42 is provided between the second conductive region 51b and the second electrode 12. The second intermediate electrode 22 is provided between the second scintillator layer 42 and the second electrode 12. The second organic semiconductor layer 32 is provided between the second intermediate electrode 22 and the second electrode 12.

Also in the radiation detector 114, one capacitor (first capacitor) is formed by the first scintillator layer 41, the first conductive layer 51, and the first intermediate electrode 21. Another capacitor (second capacitor) is formed by the second scintillator layer 42, the second conductive layer 52, and the second intermediate electrode 22. The fluctuation of the potential of the first intermediate electrode 21 according to the signal Vs1 due to the incident radiation 81 can be suppressed. The fluctuation of the potential of the second intermediate electrode 22 according to the signal Vs2 due to the incident radiation 81 can be suppressed. For example, crosstalk can be suppressed. A radiation detector capable of stable detection can be provided.

As shown in FIG. 7B, it is preferable that the second conductive layer length L52 of the second conductive layer 52 along the second direction crossing the first direction (Z-axis direction) is longer than the second electrode length L12 of the second electrode 12 along the second direction. it is preferable that the second intermediate electrode length L22 of the second intermediate electrode 22 along the second direction is longer than the second electrode length L12. It is easy to obtain the second capacitor with a large electric capacitance.

In the embodiment, the first organic semiconductor layer 31 includes, for example, a p-type region and an n-type region. The p-type region includes, for example, at least one of polythiophene or a derivative of polythiophene. The n-type region includes, for example, a fullerene derivative. In one example, the first organic semiconductor layer 31 includes, for example, Poly (3-hexylthiophene) and [6,6]-phenyl C61 butyric acid methyl ester. For example, the second organic semiconductor layer 32 includes the same material as the first organic semiconductor layer 31.

The first scintillator layer 41 includes, for example, at least one selected from the group consisting of PVT (Polyvinyltoluene), PVK (Polyvinylcarbazole), and PMMA (Polymethyl methacrylate). For example, the second scintillator layer 42 includes the same material as the first scintillator layer 41.

The base body 60s includes, for example, a resin. The resin includes, for example, at least one selected from the group consisting of PET (polyethylene terephthalate), PEN (polyethylene naphthalate), Polyimide, and PC (polycarbonate).

In the embodiment, the radiation 81 may be at least one of beta rays, gamma rays, neutron rays or X-rays.

Embodiments may include the following configurations (e.g., technological proposals).

Configuration 1

A radiation detector, comprising:
a first conductive layer including a first conductive region; and
a first stacked body,
the first stacked body including:
a first electrode separated from the first conductive region in a first direction,
a first scintillator layer provided between the first conductive region and the first electrode,
a first intermediate electrode provided between the first scintillator layer and the first electrode, and
a first organic semiconductor layer provided between the first intermediate electrode and the first electrode.

Configuration 2

The detector according to Configuration 1, wherein
the first intermediate electrode includes a first conductive film and a second conductive film,
the first conductive film includes an opening, and at least a part of the second conductive film is in the opening.

Configuration 3

The detector according to Configuration 2, wherein at least a part of the second conductive film overlaps the first conductive film in the first direction.

Configuration 4

The detector according to Configuration 2 or 3, wherein
the first conductive film includes at least one selected from the group consisting of Al, Be, Mg, Zn and C,
the second conductive film includes a compound including a first element and oxygen,
the first element includes at least one selected from the group consisting of In and Zn.

Configuration 5

The detector according to one of Configurations 2-4, wherein a light transmittance of the second conductive film with respect to a peak wavelength of a light emitted from the first scintillator layer is higher than a light transmittance of the first conductive film with respect to the peak wavelength.

Configuration 6

The detector according to one of Configurations 1-5, wherein a first conductive layer length of the first conductive layer along a second direction crossing the first direction is longer than a first electrode length of the first electrode along the second direction.

Configuration 7

The detector according to Configuration 6, wherein a first intermediate electrode length of the first intermediate electrode along the second direction is longer than the first electrode length.

Configuration 8

The detector according to one of Configurations 1-5, further comprising a second stacked body,
the first conductive layer further includes a second conductive region,
a direction from the first conductive region to the second conductive region crosses the first direction,
the second stacked body includes:
a second electrode separated from the second conductive region in the first direction,
a second scintillator layer provided between the second conductive region and the second electrode,
a second intermediate electrode provided between the second scintillator layer and the second electrode, and
a second organic semiconductor layer provided between the second intermediate electrode and the second electrode.

Configuration 9

The detector according to one of Configurations 1-5, further comprising:
a second conductive layer including a second conductive region; and
a second stacked body,
the second conductive layer being electrically connected to the first conductive layer,
a direction from the first conductive region to the second conductive region crossing the first direction,
the second stacked body including:
a second electrode separated from the second conductive region in the first direction,
a second scintillator layer provided between the second conductive region and the second electrode,
a second intermediate electrode provided between the second scintillator layer and the second electrode, and a second organic semiconductor layer provided between the second intermediate electrode and the second electrode.

Configuration 10

The detector according to Configuration 7 or 8, wherein
a first conductive layer length of the first conductive layer along a second direction crossing the first direction is longer than a first electrode length the first electrode along the second direction, and
the first conductive layer length is longer than a second electrode length of the second electrode along the second direction.

Configuration 11

The detector according to Configuration 10, wherein
a first intermediate electrode length of the first intermediate electrode along the second direction is longer than the first electrode length, and
a second intermediate electrode length of the second intermediate electrode along the second direction is longer than the second electrode length.

Configuration 12

The detector according to one of Configurations 1-11, wherein a capacitance between the first conductive layer and the first intermediate electrode is larger than 1/50 times a capacitance between the first intermediate electrode and the first electrode.

Configuration 13

The detector according to one of Configurations 1-12, wherein a thickness of the first scintillator layer along the first direction is not less than $10^2$ times and nor more than $10^4$ times a thickness of the first organic semiconductor layer along the first direction.

Configuration 14

The detector according to one of Configurations 1-13, further comprising a base body including a resin and a first face, the first conductive layer being located between the first surface and the first stacked body.

Configuration 15

The detector according to one of Configurations 1-13, further comprising a first wiring layer electrically connected to the first intermediate electrode, and
at least a part of the first wiring layer having at least one of a spiral structure or a meander structure.

Configuration 16

The detector according to Configuration 15, further comprising a base body including a resin and a first face,
the first conductive layer being located between the first surface and the first stacked body, and
at least a part of the first wiring layer being provided on the first surface.

Configuration 17

The detector according to Configuration 15 or 16, wherein the first wiring layer includes at least one selected from the group consisting of Al, Be, Mg, Zn and C.

Configuration 18

The detector according to one of Configurations 15-17, further comprising a wiring configured to electrically connect the first intermediate electrode to a controller, and
the wiring includes the first wiring layer.

Configuration 19

The detector according to one of Configurations 1-17, further comprising:
a controller;
a first wiring configured to electrically connect the first conductive layer to the controller;
a second wiring configured to electrically connect the first intermediate electrode to the controller, and
a third wiring configured to electrically connect the first electrode to the controller,
the controller being configured to set the first conductive layer to a first potential, and to set the first intermediate electrode to a second potential, and
the controller being configured to output a signal corresponding to a signal obtained from the first electrode generated in response to a radiation incident on the first scintillator layer.

Configuration 20

The detector according to one of Configurations 1-19, wherein at least one of the first electrode or the first intermediate electrode includes at least one selected from the group consisting of Al, Be, Mg, Zn and C.

According to embodiments, a radiation detector can be provided in which the sensitivity can be increased.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, electrodes, organic semiconductor layers, scintillator layers, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
   a first conductive layer including a first conductive region; and
   a first stacked body,
   the first stacked body including:
      a first electrode separated from the first conductive region in a first direction,
      a first scintillator layer provided between the first conductive region and the first electrode,
      a first intermediate electrode provided between the first scintillator layer and the first electrode, and
      a first organic semiconductor layer provided between the first intermediate electrode and the first electrode, wherein
   the first intermediate electrode includes a first conductive film and a second conductive film,
   the first conductive film includes an opening, and
   at least a part of the second conductive film is in the opening.

2. The detector according to claim 1, wherein at least a part of the second conductive film overlaps the first conductive film in the first direction.

3. The detector according to claim 1, wherein
   the first conductive film includes at least one selected from the group consisting of Al, Be, Mg, Zn and C,
   the second conductive film includes a compound including a first element and oxygen, and
   the first element includes at least one selected from the group consisting of In and Zn.

4. The detector according to claim 1, wherein a light transmittance of the second conductive film with respect to a peak wavelength of a light emitted from the first scintillator layer is higher than a light transmittance of the first conductive film with respect to the peak wavelength.

5. The detector according to claim 1, wherein a first conductive layer length of the first conductive layer along a second direction crossing the first direction is longer than a first electrode length of the first electrode along the second direction.

6. The detector according to claim 5, wherein a first intermediate electrode length of the first intermediate electrode along the second direction is longer than the first electrode length.

7. The detector according to claim 1, further comprising a second stacked body,
   the first conductive layer further includes a second conductive region,
   a direction from the first conductive region to the second conductive region crosses the first direction,
   the second stacked body includes:
      a second electrode separated from the second conductive region in the first direction,
      a second scintillator layer provided between the second conductive region and the second electrode,
      a second intermediate electrode provided between the second scintillator layer and the second electrode, and
      a second organic semiconductor layer provided between the second intermediate electrode and the second electrode.

8. The detector according to claim 7, wherein
   a first conductive layer length of the first conductive layer along a second direction crossing the first direction is longer than a first electrode length the first electrode along the second direction, and
   the first conductive layer length is longer than a second electrode length of the second electrode along the second direction.

9. The detector according to claim 8, wherein
   a first intermediate electrode length of the first intermediate electrode along the second direction is longer than the first electrode length, and
   a second intermediate electrode length of the second intermediate electrode along the second direction is longer than the second electrode length.

10. The detector according to claim 1, further comprising:
   a second conductive layer including a second conductive region; and
   a second stacked body,
   the second conductive layer being electrically connected to the first conductive layer, a direction from the first conductive region to the second conductive region crossing the first direction,
   the second stacked body including:
      a second electrode separated from the second conductive region in the first direction,
      a second scintillator layer provided between the second conductive region and the second electrode,
      a second intermediate electrode provided between the second scintillator layer and the second electrode, and
      a second organic semiconductor layer provided between the second intermediate electrode and the second electrode.

11. The detector according to claim 1, wherein a capacitance between the first conductive layer and the first intermediate electrode is larger than 1/50 times a capacitance between the first intermediate electrode and the first electrode.

12. The detector according to claim 1, wherein a thickness of the first scintillator layer along the first direction is not less than 102 times and nor more than 104 times a thickness of the first organic semiconductor layer along the first direction.

13. The detector according to claim 1, further comprising a base body including a resin and a first face,
   the first conductive layer being located between a first surface and the first stacked body.

14. The detector according to claim 1, further comprising a first wiring layer electrically connected to the first intermediate electrode, and at least a part of the first wiring layer having at least one of a spiral structure or a meander structure.

15. The detector according to claim 14, further comprising a base body including a resin and a first face, the first conductive layer being located between a first surface and the first stacked body, and at least a part of the first wiring layer being provided on the first surface.

16. The detector according to claim 14, wherein the first wiring layer includes at least one selected from the group consisting of Al, Be, Mg, Zn and C.

17. The detector according to claim 14, further comprising a wiring configured to electrically connect the first intermediate electrode to a controller, and the wiring includes the first wiring layer.

18. The detector according to claim 1, further comprising:

a controller;

a first wiring configured to electrically connect the first conductive layer to the controller;

a second wiring configured to electrically connect the first intermediate electrode to the controller, and a third wiring configured to electrically connect the first electrode to the controller, the controller being configured to set the first conductive layer to a first potential, and to set the first intermediate electrode to a second potential, and the controller being configured to output a signal corresponding to a signal obtained from the first electrode generated in response to a radiation incident on the first scintillator layer.

19. The detector according to claim 1, wherein at least one of the first electrode or the first intermediate electrode includes at least one selected from the group consisting of Al, Be, Mg, Zn and C.

* * * * *